Sept. 2, 1958  P. R. HOFFMAN  2,850,651

PIEZOELECTRIC CRYSTAL SUPPORT

Filed March 2, 1954

INVENTOR

Philip R. Hoffman

BY Cushman, Darby & Cushman

ATTORNEYS

United States Patent Office 2,850,651

Patented Sept. 2, 1958

2,850,651

PIEZOELECTRIC CRYSTAL SUPPORT

Philip R. Hoffman, Carlisle, Pa., assignor to P. R. Hoffman Company, Carlisle, Pa., a corporation of Pennsylvania Application March 2, 1954, Serial No. 413,565

16 Claims. (Cl. 310—9.4)

This invention relates to piezoelectric quartz crystal apparatus, and more particularly to an improved mounting arrangement for piezoelectric quartz crystals, especially thin high-frequency piezoelectric quartz crystals.

Various types of mountings have been developed for supporting piezoelectric quartz crystals, but substantially all mountings heretofore developed have the disadvantage of mechanically stressing the crystals to such an extent that fracture thereof and damage thereto is relatively frequent. Many of such mountings exert a clamping force on portions of the crystal, which force is exerted perpendicular to the major faces of the crystal. Further, many of such mountings include two spring wires or other types of spring supports which must be spread apart from each other to enable the insertion of the crystal therebetween. This type of mounting also tends to impart an additional mechanical stress to the crystal in directions parallel to the planes of its major faces.

All of the above types of mountings are particularly objectionable when the crystal to be mounted is quite thin, e. g., of the order of less than .010″. Obviously, such thin crystals are relatively easily chipped, fractured, or otherwise damaged by mechanical stresses imposed thereon.

Accordingly, it is an object of this invention to provide an improved mounting arrangement for piezoelectric quartz crystals which imposes no physical strains on the crystal.

It is another object of this invention to provide an improved shock-resistant mounting arrangement for piezoelectric quartz crystals which places no mechanical stress on the supported crystal.

It is still another object of this invention to provide an improved two-element mounting arrangement for piezoelectric quartz crystals wherein the elements also constitute conductors that are electrically connected to electrode coatings on the opposite major faces of the crystal.

It is a further object of this invention to provide an improved mounting arrangement for piezoelectric quartz crystals which meets the foregoing objects and wherein the arrangement facilitates the application of conducting cementitious means which both firmly fastens the crystal to the supporting structure and makes electrical connections to the electrode coatings on the crystal.

Other objects and advantages of the invention will become apparent from the following description and accompanying drawings, in which.

Figure 1:
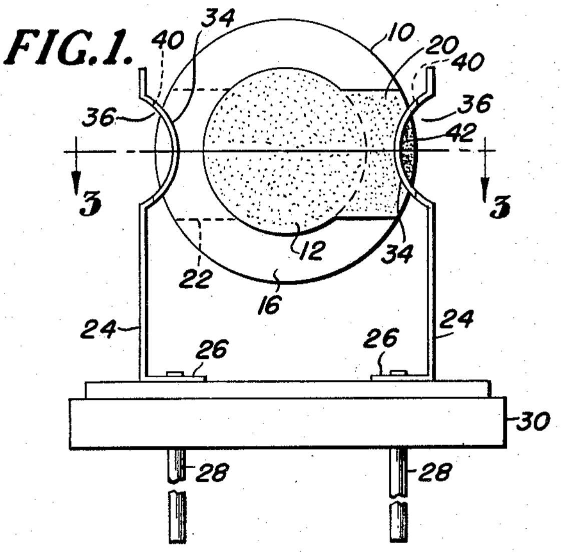
Figure 1 is an elevational view of a piezoelectric quartz crystal apparatus assembly or unit embodying this invention.
Figure 2:
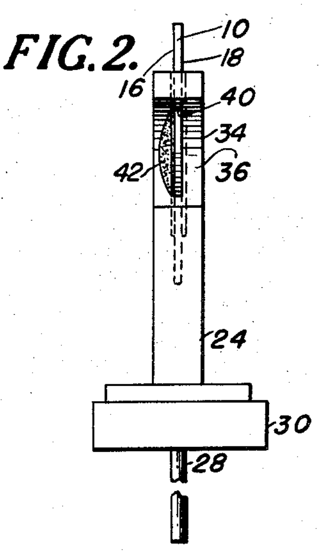
Figure 2 is a side view of the apparatus shown in Figure 1.
Figures 3, 4, 5, 6:
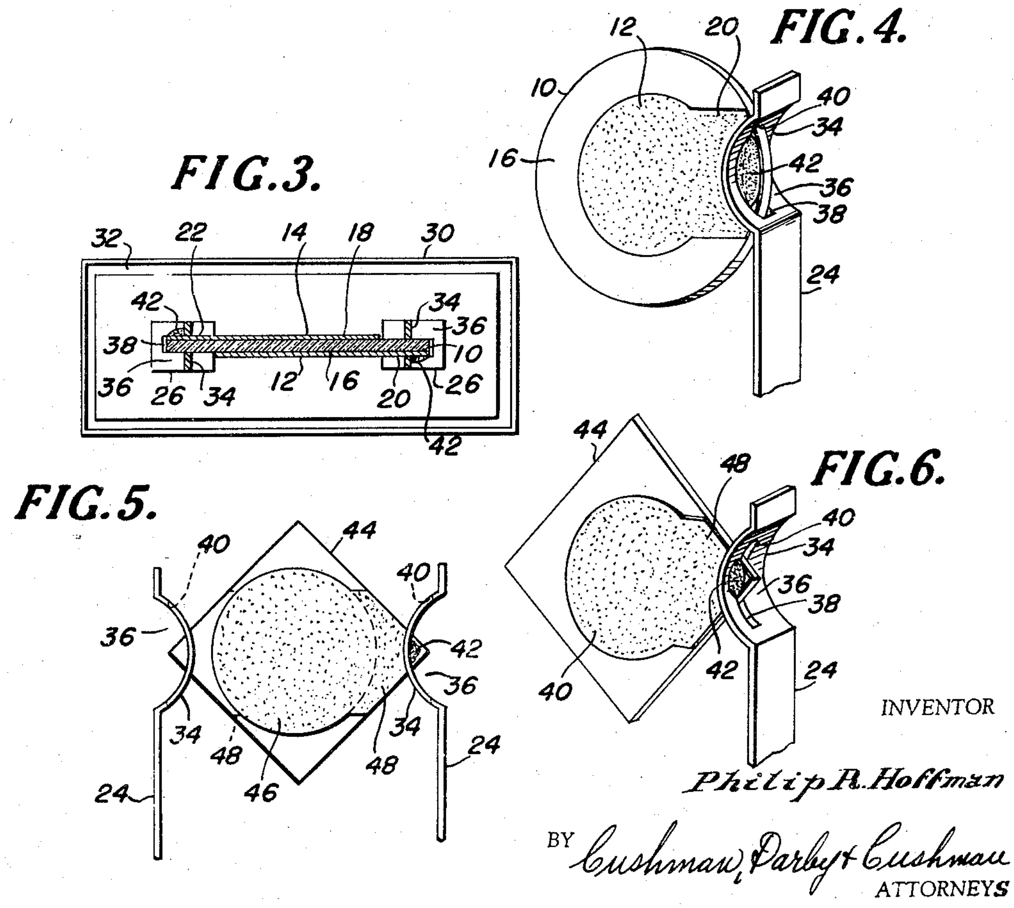
Figure 3 is a horizontal sectional view taken on lines 3—3 of Figure 1.
Figure 4 is a fragmentary perspective view of a portion of the apparatus shown in Figure 1.
Figure 5 is a fragmentary elevational view corresponding to Figure 1, but illustrating the application of a mounting embodying this invention for supporting a square quartz crystal.
Figure 6 is a fragmentary perspective view of a portion of the apparatus shown in Figure 5.

Referring now to the drawings, there is shown in Figures 1 to 4 a circular piezoelectric quartz crystal plate 10 having electrode coatings or platings 12 and 14 on the central areas of its opposite major faces 16 and 18, respectively, as is well known in the art. Although the coatings 12 and 14 are shown as being circular in configuration, other shapes may be employed, e. g., rectangular, square, etc. Further, the coatings 12 and 14 may be of the same size, as shown, or of different size. Extending from the coatings 12 and 14 to opposite edges of the crystal plate 10 are the usual conductive tabs 20 and 22, likewise formed by conductive coatings or platings. These tabs 20 and 22 extend in opposite directions, as is best shown in Figures 1 and 3 of the drawings.

The mounting for the crystal plate 10 embodying this invention comprises two parallel conductive spring strips 24 which may be formed of any suitable material. An example of appropriate material is phosphor-bronze which is preferably plated with the same material forming the tabs 20 and 22, e. g., silver, gold, etc. Exemplary dimensions of the strips 24 for supporting an extremely thin crystal plate, e. g., of the order of .007″ or less in thickness, are a strip thickness of .005″ and a strip width of .040″. At one end, the two strips 24 have a 90° bend therein forming a supporting tab 26 that is mechanically and electrically connected to contact pins 28 on a conventional crystal holder base 30. If the base 30 is formed of a conductive material, the pins 28 and the strip tabs 26 are appropriately insulated therefrom by suitable means (not shown). Preferably, the base 30 is provided with a peripheral groove 32 (Figure 3) in its upper side for the reception of the marginal edge portions of the open end of a housing (not shown), which housing may be secured in any appropriate manner to the base and hermetically sealed.

Adjacent their free ends, the supporting strips 24 have portions 34 thereof which are displaced out of the plane of the corresponding strip toward the other strip. Both ends of each displaced portion 34 are joined to straight sections of the corresponding strip. For ease in manufacture and to minimize internal stresses in the strips 24, the displaced portions 34 preferably are arcuate in configuration, as shown, and essentially form oppositely-facing arcuate recesses 36 in the strips. A longitudinally-extending slot 38 (Figure 4) is formed in the displaced portion 34 of each strip 24, and the side edges of each slot 38 straddle an edge portion of the crystal plate 10 at the corresponding conductive tab 20 or 22. Preferably, the width of the slot 38 in each strip 24 is only slightly greater than the thickness of the crystal plate 10 including the thickness of the conductive tab 20 or 22 on one side thereof, so that the plate is freely receivable in the slots. The slots 38 are extended in length sufficiently so that the distance between the ends 40 of the top slots adjacent the free ends of the strips 24 is greater than the diameter of the crystal plate 10, in order for the latter to be freely insertable endwise into the slots without spreading the two spring strips. Opposite marginal edge portions of the crystal plate 10 project completely through the slots 38 in the spring strips 24 and into the oppositely-facing recesses 36 formed by the displaced portions 34.

In order to mechanically secure the crystal plate 10 to the two spring strips 24 and also to establish a good electrical connection between each tab 20 and 22 and its corresponding spring strip, a conductive cementitious material 42, of which suitable types are well known in the art, is applied into the well-like recess or corner formed by that portion of the face of a tab 20 or 22 which projects into the strip recess 36 and the adjacent perpendicular face of the displaced portion 34 of each strip along the edge of the slot 38 therein. It thus will be seen that the cement 42 is applied to an extended area of both the crystal plate 10, i. e., the tab 20 or 22 thereon, and the corresponding spring strip 24 to provide a firm shock-proof support for the crystal plate. Preferably, the metallic component of the cement 42 is the same as that of the electrode and the tab coatings 12, 14, 20, and 22 on the plate 10 and the same as the plating on the strips 24. It also will be seen that the crystal plate 10 is under no strain or stress during the cementing operation, since no force is applied to the crystal plate by the support strips 24. It also is emphasized that the areas of the strip 24 and of the plate 10 to which the conductive cement is applied form a well-like configuration that greatly facilitates the application of the conductive cement.

The support strips 24 may be used equally well to support a square crystal, as is shown in Figure 5. In this embodiment of the invention, a square crystal plate 44 has circular electrode coatings 46 on its opposite edge or faces, the coatings 46 being provided with conductive tabs 48 formed by integral conductive coatings that extend to diagonally-opposite corner edges of the plate 44. These corner edges of the plate 44 are likewise freely receivable in the slots 38 in the supporting strips 24 and fastened thereto by conductive cement 42. Again, the distance between the two ends 40 of the slots 38 adjacent the free ends of the strips 24 is sufficient to enable the opposite corner edges of the plate 44 to be freely inserted in the slots 38 without spreading the two spring strips 24 apart. Further, conductive bonding cement 42 is applied in the same manner as is shown in the embodiments disclosed in Figures 1 to 4, to both mechanically secure the square plate 44 to the strips 24 and to establish electrical connections between each strip 24 and its corresponding conductive tab 48 on the plate 44.

It thus will be seen that the objects of this invention have been fully and effectively accomplished. It will be realized, however, that the specific embodiments shown and described for the purpose of illustrating the principles of the invention are subject to modification without departure from such principles. Therefore, this invention includes all modifications encompassed within the spirit and scope of the following claims.

I claim:

1. A support for a piezoelectric crystal plate comprising two strips mounted parallel to each other, each said strip having a free end section provided with a portion displaced out of the plane of said strip toward the other strip, said displaced portions being opposite each other and each said portion having a longitudinal slot therein for freely receiving opposite marginal edge portions of a crystal plate in said slots to support the plate without mechanical stresses therein.

2. The structure defined in claim 1 in which the displaced portions are curved and joined at each end thereof to straight strip sections.

3. A support element for a piezoelectric crystal plate comprising a conductive metallic strip having an integral conductive portion adjacent one end thereof displaced out of the plane of said strip, said portion having a longitudinal slot therein of uniform width substantially throughout its length, said width being slightly greater than the thickness of the crystal plate for freely receiving a marginal edge portion of the crystal plate between the edges of said slot to support the plate without mechanical stresses therein.

4. The structure defined in claim 3 in which the displaced portion is curved and joined at each end thereof to straight strip sections.

5. In a conductive supporting system for a piezoelectric crystal plate having an electrode coating on a major face thereof the combination comprising: a conductive spring strip provided with a portion displaced out of the plane of said strip, said portion having a longitudinal slot therein of a uniform width, slightly greater than the thickness of the plate, substantially throughout the length of said slot, the side edges of said slot freely straddling an edge portion of the crystal plate to support the latter without mechanical stresses therein; and conductive cementitious means securing said displaced portion to the plate edge portion and establishing an electrical connection between said strip and the electrode coating adjacent the plate edge portion.

6. A piezoelectric crystal apparatus assembly comprising: a pair of strips mounted parallel to each other, each said strip having a free end section provided with a portion displaced out of the plane of said strip toward the other strip, said displaced portions being opposite each other and each said portion having a longitudinal slot therein; a piezoelectric crystal plate having opposite edge portions thereof disposed in said slots without the imposition of mechanical stresses in said plate; and cementitious means securing said crystal edge portions to said strip displaced portions.

7. The structure defined in claim 6 wherein the maximum transverse dimension of the plate measured across the said edge portions thereof is greater than the minor distance between the displaced portions of the strips but small enough for free insertion of said plate into the slots without deformation of said strips.

8. The structure defined in claim 6 wherein the displaced strip portions are curved and joined at each end thereof to straight strip sections.

9. The structure defined in claim 8 wherein the distance between the two slot ends adjacent the free ends of the strips is greater than the maximum transverse dimension of the plate measured across the edge portions thereof to enable free insertion of said plate into said slots without flexure of said strips.

10. A piezoelectric crystal apparatus assembly comprising: a pair of conductive spring strips mounted parallel to each other, each said strip having a free end section provided with a portion displaced out of the plane of said strip toward the other strip, said displaced portions being opposite each other and each said portion having a longitudinal slot therein; a piezoelectric crystal plate having opposite edge portions thereof disposed in said slots and projecting therethrough without the imposition of mechanical stresses in said plate; electrode coatings on the opposite major faces of said plate extending in opposite directions to opposite edge portions of said plate; and conductive cementitious means securing each of said strip displaced portions to the corresponding plate edge portion and establishing an electrical connection between each said strip and the corresponding one of said coatings adjacent said corresponding plate edge portion without imposing mechanical stresses thereon.

11. The structure defined in claim 10 wherein the maximum transverse dimension of the plate measured across the said edge portions thereof is small enough for free insertion of said plate into the slots without flexure of the strips.

12. The structure defined in claim 10 wherein each of the cementitious means is disposed in a corner defined by the concave face of the corresponding displaced strip portion and a portion of a major face of the plate which projects through the slot in said displaced portion.

13. The structure defined in claim 10 wherein both ends of said slots are closed and the distance between the two slot ends adjacent the free ends of the strips is greater than the maximum transverse dimension of the plate measured across the said edge portions thereof to enable free insertion of said plate into said slots without flexure of said strips.

14. A support for a piezoelectric crystal plate comprising: base means; and an elongated conductive strip secured at one end thereof to said base means and having an integral free end section provided with a longitudinal slot therein of uniform width substantially throughout its length, said width being slightly greater than the thickness of the crystal plate for freely receiving a marginal edge portion of the crystal plate without imposing mechanical stresses thereon.

15. A support element for a piezoelectric crystal plate comprising a conductive strip having a longitudinal slot therein adjacent one end thereof, said slot being of uniform width substantially throughout its length and said width being slightly greater than the thickness of the crystal plate for freely receiving a marginal edge portion of the crystal plate without imposing mechanical stresses thereon.

16. In a conductive supporting system for a piezoelectric crystal plate having an electrode coating on a major face thereof, the combination comprising: a conductive strip having a longtiudinal slot therein of a uniform width, slightly greater than the thickness of the plate, throughout the length of said slot, the side edges of said slot straddling an edge portion of the crystal plate without imposing mechanical stresses thereon; and conductive cementitious means securing said strip to the plate edge portion and establishing an electrical connection between said strip and the electrode coating adjacent the plate edge portion.

References Cited in the file of this patent

UNITED STATES PATENTS

| | | |
|---|---|---|
| 2,275,122 | Ziegler | Mar. 3, 1942 |
| 2,392,429 | Sykes | Jan. 8, 1946 |
| 2,457,145 | Gray | Dec. 28, 1948 |
| 2,471,625 | Johnstone | May 31, 1949 |